FREQUENCY GENERATOR WITH HETERODYNE FREQUENCY CONTROL

Filed Feb. 8, 1960 2 Sheets-Sheet 1

Inventor
Norman J. Foot
By Hofgren, Brady, Wegner, Allen & Stellman
Attorneys

FREQUENCY GENERATOR WITH HETERODYNE FREQUENCY CONTROL

Inventor
Norman J. Foot
By Hofgren, Brady, Wegner, Allen & Stellman
Attorneys 3,177,444
Patented Apr. 6, 1965

3,177,444

FREQUENCY GENERATOR WITH HETERODYNE FREQUENCY CONTROL

Norman J. Foot, Elmhurst, Ill., assignor to The Hallicrafters Co., a corporation of Delaware Filed Feb. 8, 1960, Ser. No. 7,282
6 Claims. (Cl. 331—22)

This invention is concerned with a variable frequency signal generator or synthesizer which provides accurately controlled signals at one of a large number of discrete frequencies over a wide range.

In many types of electronic equipment it is desirable to have available a wide range of frequencies which are accurately controlled, without requiring a control device, as a crystal circuit, for each frequency. For example, in a radio transmitter or the local oscillator of a receiver, it may be desirable to use different carrier or oscillator frequencies from time to time, preferably without changing individual circuit components for each frequency change. More specifically, communications equipment may have an oscillator with a frequency range of several megacycles and provide accurately controlled signals in one kilocycle or five kilocycle steps throughout the oscillator range, giving the operator a choice of several hundred or even several thousand channels.

A principal object of this invention is the provision of such a signal generator with a minimum of control circuitry and elements.

One feature of the invention is the provision of a frequency generator including a variable frequency oscillator having a control element, a plurality of reference signals having related frequencies; means for mixing the oscillator output with a selected reference signal; means for deriving a control signal from the products of said mixing means, and means for applying the control signal to the control element of the oscillator.

Another and more specific feature of the invention is that three signals are mixed, as one derived from the oscillator and two from the reference source, equally spaced on either side of the signal derived from the oscillator when the oscillator is operating at the desired frequency. These signals are mixed in a balanced detector, the output of which includes signals of two different frequencies when the oscillator frequency differs from that desired and a single frequency when the oscillator operates properly. A final detector stage derives a control signal which is a function of the balanced detector output, controlling the frequency of the oscillator.

A further feature is that the mixing means includes a plurality of cascade connected mixing stages with a plurality of reference signals for each stage, the separation of the reference signals being smaller for each succeeding stage, providing an increasingly fine or "vernier" control over the frequency of the oscillator.

Still another feature is that the source of reference signals includes a crystal controlled oscillator with multiplier and divider circuits producing a plurality of signals, and filters for selecting the desired signal to be used in the mixers.

And a further feature is the provision of an auxiliary control signal source responsive to the condition of the control signal derived from the balanced detector for varying the oscillator frequency to bring it within the range of control of the detector circuit.

Further features and advantages will be apparent from the following specification and from the drawings, in which.

An important use of a controlled variable signal generator disclosed herein is in multichannel radio equipment. Military equipment in particular requires a great many readily selectable channels to allow communication between various units without interference. The signal generator must have discrete output signals available over a substantial range, must hold exact synchronism or other predetermined relation of the generated signal with a standard or reference signal and should have no extraneous radio frequencies in the output. These requirements are satisfied by the system disclosed herein. During the course of the description of the invention, specific frequency relationships will be described. It will be understood that these relationships are given solely for explaining the operation of the system and that many other frequency combinations and relationships are possible.

Figures 1, 3:
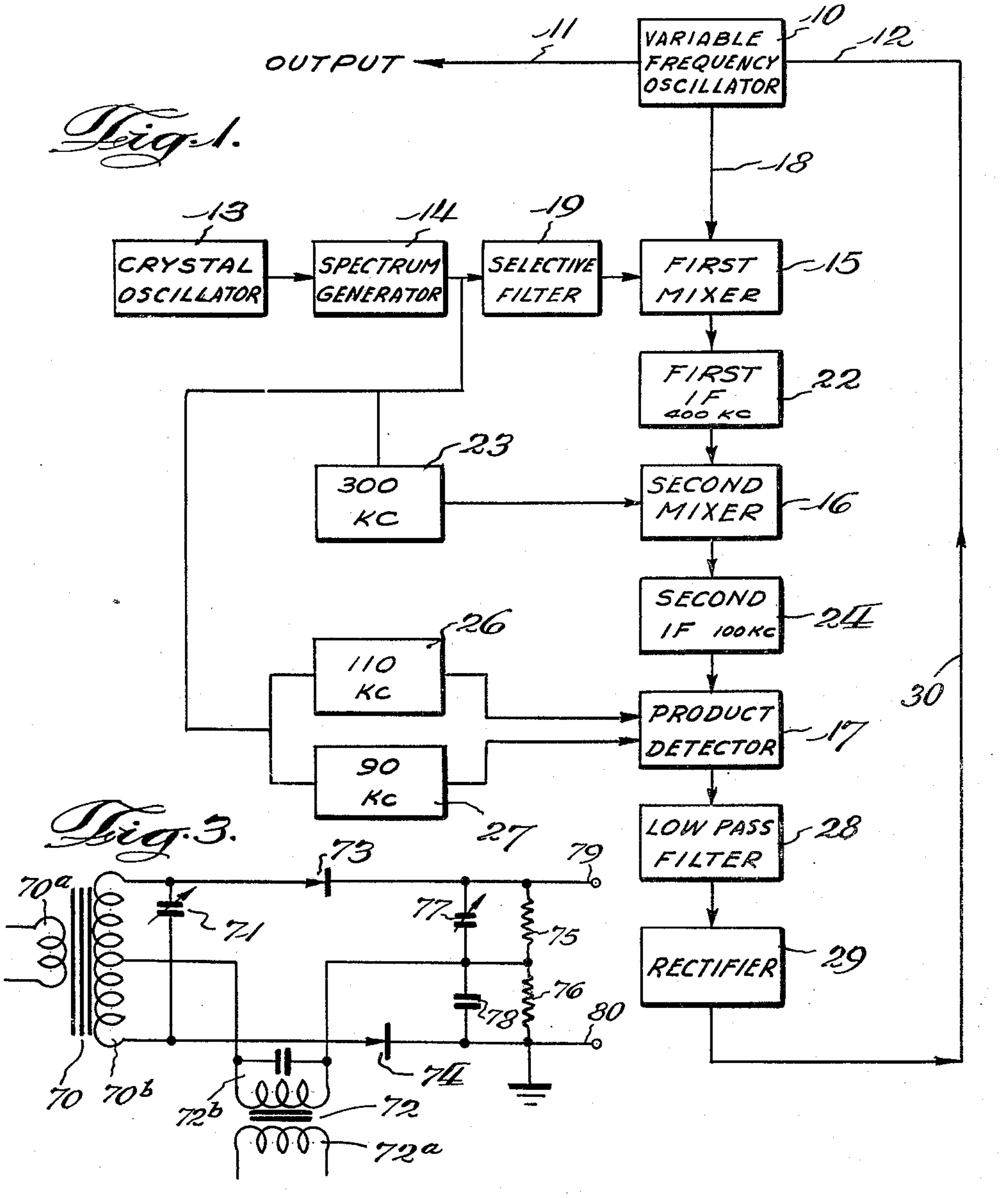
FIGURE 1 is a block diagram of a simplified system illustrating the invention, principally for purposes of explanation.
FIGURE 3 is a schematic diagram of a balanced detector.

Referring now to the drawings, in FIGURE 1, a variable frequency oscillator 10 provides an output at 11 which may serve as the carrier signal for a radio transmitter or a heterodyning signal in a receiver. The oscillator circuit includes a control element, an example of which will be described in more detail below, responsive to a control signal applied at 12 to vary the frequency of the oscillator within certain limits. A crystal oscillator 13 provides a stable, constant frequency reference signal which actuates a spectrum generator 14 establishing a plurality of related, crystal controlled signals at different frequencies, one or more of which may be selected by means of suitable filters.

A series of cascade-connected mixers 15, 16 and 17 are supplied with signals from the variable frequency oscillator 10 and spectrum generator 14 yielding a control signal connected at 12 with the control element of the oscillator adjusting the oscillator to operate at the desired frequency as determined by the frequencies of the reference signals.

The basic operation of the system will now be considered, assuming that an oscillator frequency of 1.0 megacycle is desired. A portion of the signal from oscillator 10 is connected at 18 with first mixer 15. Selective filter 19 provides a reference signal at a frequency of 1.4 megacycles to the first mixer, and if oscillator 10 is exactly at 1.0 megacycle one of the mixing products of mixer 15 is 400 kilocycles, the difference between the two input signals and a frequency which the first intermediate frequency stage 22 will pass. The band pass of IF stage 22 is such that all other frequencies in mixer 15, i.e., 1.0 megacycle, 1.4 megacycles and 2.4 megacycles are rejected. A 300 kilocycle signal is provided through selective filter 23 to second mixer 16 where it is heterodyned or mixed with the 400 kilocycle signal from first intermediate frequency amplifier 22 yielding a difference signal of 100 kilocycles, a frequency which the second intermediate frequency stage 24 passes. Balanced product detector 17 receives the 100 kilocycle signal from second intermediate frequency amplifier 24 and from filters 26 and 27 a pair of reference signals at 110 kilocycles and 90 kilocycles, equally spaced on either side of the 100 kilocycle signal which is effectively derived from the variable frequency oscillator. The balanced product detector 17 has an output which includes the sum and difference of all the input signals, a portion of which are used in controlling the operation of the oscillator. Low pass filter 28 removes the detector or mixer products which are not desired, passing only the desired signal to a rectifier 29, the output of which is connected through a feedback connection 30 with the control element of the variable frequency oscillator 10.

If the variable frequency oscillator is exactly at 1 megacycle, the desired frequency, the output signal of the second IF stage 24 is exactly 100 kilocycles and the difference between this signal and the two reference signals (90 kilocycles and 110 kilocycles) are both 10 kilocycles. This situation yields a steady state control signal which maintains the oscillator at the frequency of 1 megacycle. If the oscillator should vary from the desired frequency, above or below 1.0 megacycle, the output of the second IF stage 24 varies from the 100 kilocycle frequency and the difference between this signal and the two reference signals yields two frequencies, one above and the other below 10 kilocycles. In this situation, the output of rectifier 29 includes an alternating potential at a frequency equal to the difference between the two products of detector 17. For example, if variable frequency oscillator 10 is at 1.001 megacycles, the signal to first IF stage 22 is 399 kilocycles and that to second IF stage 24, 99 kilocycles. The outputs of product detector 17 in this situation are 9 kilocycles and 11 kilocycles, with the output of rectifier 29 having a component at two kilocycles which varies the frequency of oscillator 10 at the two kilocycle rate returning the oscillator 10 to the desired frequency. The frequency of the control signal changes as the frequency of the oscillator changes and is a D.C. signal when the oscillator is at the desired frequency.

The operation of the control system is identical when the variable frequency oscillator 10 drops below the desired frequency. The product detector 17 is not sensitive to the direction of deviation of the variable frequency oscillator and as the control signal derived from rectifier 29 includes an alternating potential which increases and decreases the frequency of oscillator 10, phasing of the feedback system is not necessary.

A change in one or more of the reference signals changes the frequency at which oscillator 10 operates. If the range of the control element is insufficient to achieve the range of frequencies desired, components, as inductors or capacitors in the oscillator circuit may be changed to extend the operating range.

The absolute accuracy with which the oscillator 10 operates is determined by the accuracy of crystal oscillator 13 which may be provided with a temperature and humidity controlled cabinet and other auxiliary features providing system stability.

Figures 2, 4, 5:
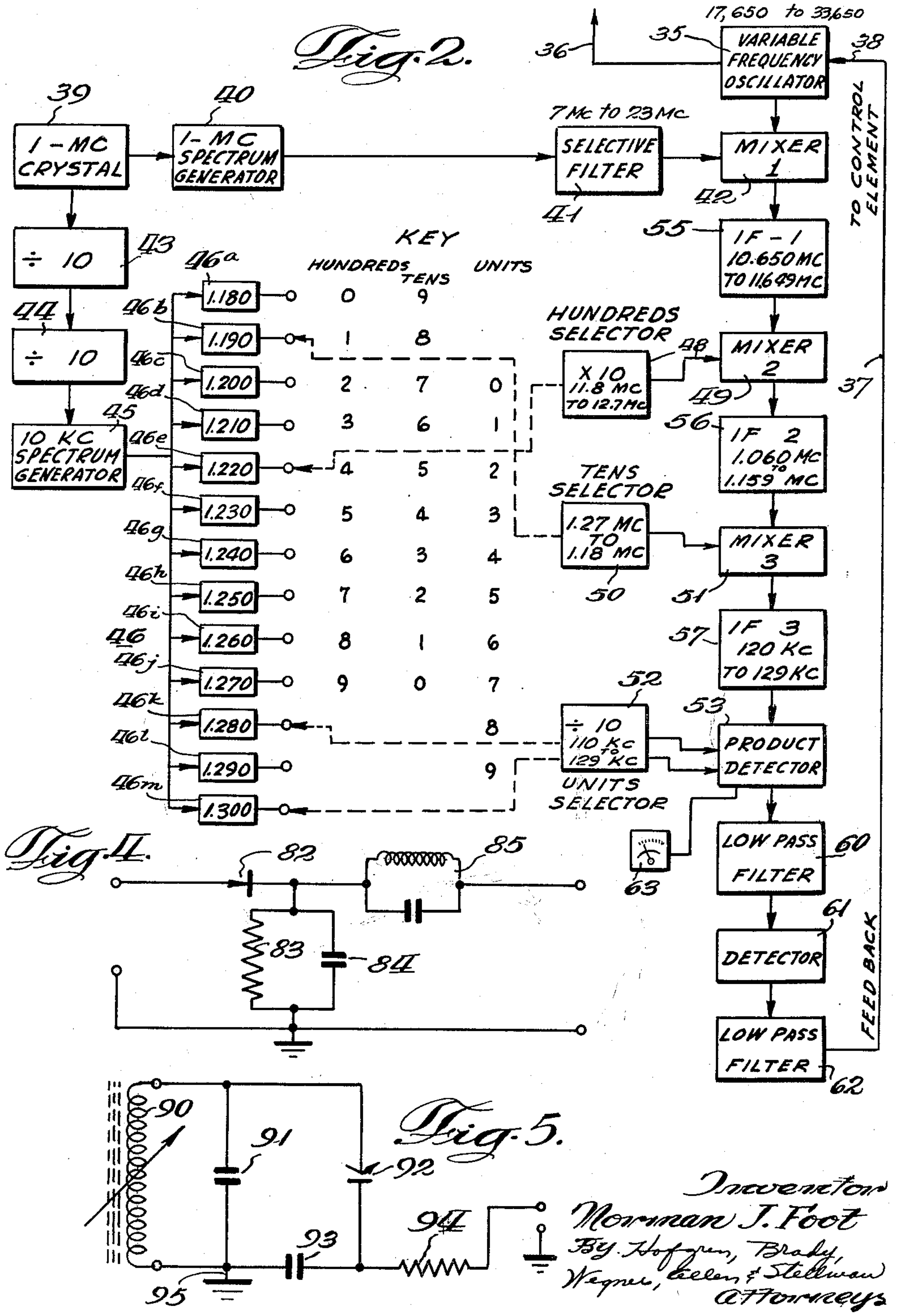
FIGURE 2 is a block diagram of a preferred embodiment of the invention.
FIGURE 4 is a schematic diagram of a detector.
FIGURE 5 is a schematic diagram of the tuned circuit of the oscillator.

The versatility and range of the system are better illustrated by the block diagram of FIGURE 2.

The variable frequency oscillator 35 has a range of 17.650 megacycles to 33.650 megacycles with an output 36 which may deliver the oscillator signal to suitable utilization circuitry, as in a transmitter or receiver. Control signal feedback loop 37 is connected at 38 with an oscillator frequency control element.

The reference signal portion of the system includes a 1 megacycle crystal controlled oscillator 39, the accuracy of which determines the accuracy of the system. A portion of the 1 megacycle signal actuates a 1 megacycle spectrum generator 40 providing a plurality of signals at 1 megacycle intervals, one of which may be selected by filter 41 providing a choice of heterodyning frequencies for first mixer 42 of 7 to 23 megacycles. Another 1 megacycle signal from crystal oscillator 39, is passed through successive dividing stages 43 and 44 each of which divide the frequency by a factor of 10, divider 44 having an output at 10 kilocycles which actuates a 10 kilocycle spectrum generator 45, having an output comprising a plurality of signals at 10 kilocycle intervals. All of the heterodyne reference frequencies necessary for the remainder of the cascade heterodyne system of FIGURE 2 may be obtained from 13 signals in the output of spectrum generator 45 having frequencies from 1.180 megacycles to 1.300 megacycles, selected by appropriate filters **46*a*–46*m***.

The successive stages of the heterodyning system have a decimal relation with a hundreds selector 48 providing the heterodyning signal for second mixer 49, a tens selector 50 providing a heterodyning signal for third mixer 51 and a units selector 52 providing a pair of spaced signals for product detector 53. Hundreds selector 48 includes a frequency multiplier which raises the frequency of the selected signal by a factor of 10, with an output covering the range 11.80 megacycles to 12.70 megacycles. Tens selector 50 utilizes the output of filters 46 directly, covering a range from 1.270 megacycles from 1.180 megacycles. Units selector 52 includes a circuit which divides the frequency of the selected signals by a factor of 10, and couples two spaced signals to product detector 53. The outputs of units selector 52 are two signals spaced 2 kilocycles apart. In the following discussion, the frequency of the units selector setting will be referred to as the frequency intermediate the two output signals. For example, as shown in the drawing, the units selector output signals are at 128 kilocycles and 130 kilocycles, and the setting of the selector is 129 kilocycles.

In the cascade heterodyne channel, the output of first mixer 42 is connected with first IF stage 55 which has a band pass from 10.650 megacycles to 11.649 megacycles. The output of second mixer 49 is connected with second IF stage 56 which has a band pass of 1.060 megacycles to 1.159 megacycles. Third mixer 51 is followed by the third IF stage 57 which has a band pass of 120 kilocycles to 129 kilocycles.

The output of product detector 53 includes a 2 kilocycle signal produced by the two selected signals injected by unit selector 52 and a two-tone signal which degenerates into a 1 kilocycle sine wave as oscillator 35 becomes locked with the synchronizing signal. The 2 kilocycle signal is removed by low pass filter 60, the 1 kilocycle or two-tone signal is coupled to detector 61 and the output control signal taken through low pass filter 62, which may eliminate the 1 kilocycle component, to feedback circuit 37.

As described in connection with FIGURE 1, each step of the multiple heterodyning system provides a finer or more accurate control over the frequency of the variable frequency oscillator, in the nature of a multi-step vernier adjustment. As an example of the operation of the system, assume that oscillator 35 is to operate at a frequency of 20.139 megacycles. The following discussion presumes that the oscillator is exactly at this frequency. In first mixer 42, the oscillator output is mixed with a 9 megacycle signal yielding a difference signal of 11.139 megacycles which is passed by first IF stage 55, the other mixer products being outside the pass band. In second mixer 49 the 11.39 signal is mixed with a reference signal at 12.2 megacycles yielding a difference signal of 1.061 megacycles which is passed by second IF stage 56. The tens selector 50 couples a signal of 1.190 megacycles to mixer 3 which combines with the 1.061 megacycle signal yielding a difference signal of 129 kilocycles which is passed through the third IF stage 57. Units selector 52 when set for 129 kilocycles couples signals at 128 and 130 kilocycles to product detector 53, and so long as the oscillator 35 does not vary from its desired frequency, there is no alternating component in the output of low pass filter 62. If oscillator 35 should deviate from 20.139 megacycles, the signal from the third IF stage 57 to product detector 53 has a similar deviation and in the same direction. Thus, if the oscillator frequency drops to 20.13875 megacycles, the output of third IF stage 57 is 128.75 kilocycles. This signal combines with the dual reference signals, 128 and 130 kilocycles, in the product detector with products at 0.75 kilocycle, 1.25 kilocycles, and 2.0 kilocycles, and higher frequencies. Filter 60 eliminates the 2 kilocycle signal and all above it, passing the lower frequencies to detector 61. Detector 61 mixes the 0.75 kilocycle and 1.25 kilocycle signals yielding a control signal including D.C. and 0.50 kilocycle. All frequencies above 1 kilocycle are eliminated in filter 62, leaving a D.C. potential with 0.50 kilocycle modulation in the control signal applied to oscillator 35.

Selection of the proper settings for the hundreds, tens and units selector is facilitated by the key shown in FIGURE 2 which indicates the proper filter frequency for each of the selector units in accordance with the digit assigned to that selector. The key is used in the following manner, again assuming that a frequency of 20.139 megacycles is desired. The frequency of the reference signal to first mixer 42 is selected to place the resulting heterodyne product in the range 10.650 to 11.649 megacycles, in the example 9 megacycles. The setting for the hundreds, tens and units is determined by subtracting from the desired frequency 20.139 megacycles the lowest frequency available from oscillator 35, i.e., 17.650 megacycles. This gives a remainder of 2.489. With the hundreds selector 48 set at 4, the tens selector 50 at 8 and the units selector 52 at 9, the proper heterodyning frequencies are selected. The decimal relationship of the multiple heterodyning stages readily lends itself to control of the frequencies connected with the selectors by suitable ten-position switches.

With the oscillator frequency range of almost two-to-one illustrated in FIGURE 2, it is desirable that the frequency be set approximately by actuation of the various selector switches. For example, the switch associated with selector filter 41 which chooses the proper megacycle range for the oscillator may be used to switch coils in the tuned circuit of oscillator 35. Similarly, the switch associated with hundreds selector 48 may be utilized to position a tuning slug within the oscillator coil, or otherwise effect a relatively rough adjustment of the frequency.

In some instances the pass bands of filters 60 and 62 may be such that the system does not have an adequate pull-in range to meet all situations. A manual tuning adjustment may be provided, together with an indicator 63 connected with product detector 53, to bring oscillator 35 within the automatic control range.

Figure 6:
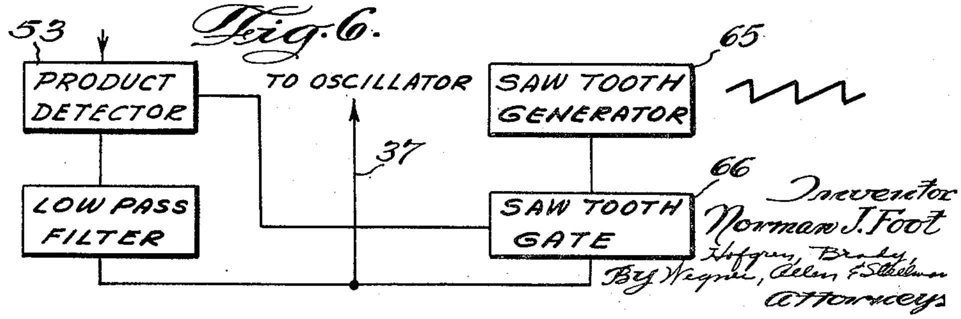
FIGURE 6 is a partial block diagram of a modified form of the invention.

FIGURE 6 illustrates in block form a circuit for automatically bringing the variable frequency oscillator 35 within the control range of the output of low pass filter 62. Generator 65 has a saw-tooth wave form output sufficient in amplitude to vary the frequency of oscillator 35 over at least the frequency range between mechanical adjustments, as provided by slug position, for example. A saw-tooth gate circuit 66 connected with the saw-tooth wave generator 65 receives a control signal from product detector 53. When there is no output in the product detector which is directly usable in controlling the oscillator 35, saw-tooth gate 66 is rendered conductive applying the saw-tooth wave form generator 65 to the feedback circuit 37 and the control element of the oscillator. One cycle of the saw-tooth wave form should be adequate to cause the oscillator frequency to pass through the range in which it may be controlled by the output of the product detector. When this occurs, the saw-tooth gate is rendered non-conductive and the control continues as discussed above.

Examples of specific circuitry suitable for various elements of the system will now be described. It will be appreciated that these circuits are disclosed only to aid in the showing of an operative system and that those skilled in the art may make modifications and substitutions in these circuits.

FIGURE 3 shows a product detector suitable for use as element 17 of FIGURE 1 or element 53 of FIGURE 2. The signal from the preceding intermediate frequency stage is connected with primary winding 70a of input transformer 70 which has a center tapped secondary winding 70b tuned by capacitor 71 to [illegible] of the pass band of the intermediate frequen[illegible] two heterodyning signals are applied to the primar[illegible] ing 72a of transformer 72 which has a secondary winding 72b connected with the center tap of winding 70b. A pair of diodes 73 and 74 connect input transformer secondary winding 70b with a load made up of resistors 75 and 76 shunted by capacitors 77 and 78, respectively. The other terminal of winding 72b is connected to the juncture of resistors 75 and 76, the mid-point of the load. Capacitor 77 is adjustable to balance the load with respect to ground. The output of the product detector, derived across the load at terminals 79 and 80, includes the three input signals, and the various sums and differences thereof.

The final detector or rectifier, as element 29, FIGURE 1 or 61 in FIGURE 2, is illustrated in FIGURE 4. The input signal, which includes the differences between the two reference signals injected into the product detector and the signal from the preceding IF stage is applied to diode detector 82 having an integrator load including resistor 83 shunted by capacitor 84. The signal across this load includes a D.C. and alternating component equal to the sum and difference of the frequencies signals in the output of the low pass filter following the product detector.

More particularly, in the system of FIGURE 1, assuming the oscillator 10 is at the desired frequency, the signal from the second IF stage 24 to product detector 17 is 100 kilocycles. Exactly half way between the reference signals of 90 kilocycles and 110 kilocycles. The output of the product detector includes components at 10 kilocycles and 20 kilocycles with the 20 kilocycle signal being eliminated in low pass filter 28. Thus the rectifier 29 has an output including a direct current potential and a 10 kilocycle alternating signal. However, in this situation, no alternating control signal is desired as oscillator 10 is operating at the proper frequency. Accordingly, parallel resonant trap circuit 85 is connected in series with the output of the rectifier tuned to the sum and difference frequency derived from product detector 17 when the oscillator is operating at the desired frequency. If the frequency of the oscillator deviates from that desired, as when the output of second IF stage is 101 kilocycles, the output of the product detector includes signals at 9 and 11 kilocycles and the output of the final rectifier or detector includes the sum and difference of these two signals, i.e., 2 kilocycles and 20 kilocycles. The sum signal is eliminated by the low pass filter and the difference signal, 2 kilocycles applied to the control circuit.

FIGURE 5 illustrates an embodiment of the tuned circuit for oscillator 10 or 35. An inductor 90, which may be switched to provide different ranges of operation, is tuned with an adjustable core which may be varied in position by mechanical interconnection with one of the frequency selector switches or a separate manual control, as pointed out above. A fixed capacitor 91 is connected in parallel with inductor 90. A voltage sensitive variable capacitor 92 is connected in parallel with capacitor 90 through a relatively large capacitor 93. The control signal, which is essentially a direct potential with an alternating component, is applied to variable capacitor 92 through series resistor 94, the control circuit being completed through inductor 90 to ground 95. The voltage sensitive variable capacitor may be of a semiconductor material, as the capacitor sold under the trademark Varicap by Pacific Semiconductors, Inc., Culver City, California. To give an idea of the range of capacity possible in this type of circuit, one such capacitor which may be assumed to have 100% capacity with an applied voltage of 4 volts has 210% capacity of 0.25 volt and 60% capacity at 12 volts.

It should be noted that the control signal is essentially a direct potential with a low frequency alternating component impressed upon it. There is no radio frequency or anything even approaching it in the control circuit to cause spurious modulation of the oscillator.

A shift in the phase of oscillator 35, which in effect is a very slow drift in frequency, produces a control signal which immediately turns the oscillator to the desired frequency. Accordingly, the oscillator always has a constant phase relationship with the crystal controlled reference oscillator even the two may not be in phase synchronism. Any tendency of the frequency of the locked oscillator to vary with temperature or humidity changes is counteracted by the control circuit with the result that there is no error in the output frequency.

While I have shown and described certain embodiments of my invention, it is to be understood that it is capable of many modifications. Changes therefore, in the construction and arrangement may be made without departing from the spirit and scope of the invention as disclosed in the appended claims.

I claim:

1. A frequency generator, comprising: a variable frequency oscillator having a control element; a source of a plurality of reference signals having related frequencies; means for mixing at least three signals derived from said oscillator and source of reference signals, at least one signal coming from each, the mixing products including signals identical in frequency when one of said signals is equally between the other two and of different frequencies when said one signal deviates therefrom; means responsive to a difference in frequency between said mixing products for deriving a control signal; and means for applying said control signal to the control element of said oscillator.

2. A frequency generator, comprising: a variable fregency oscillator having a control element; a source of a plurality of reference signal having related frequencies; means for deriving a signal from said oscillator; means for selecting two reference signals equally spaced in frequency on either side of the signal derived from the desired oscillator frequency; means for mixing said selected signals and the signal derived from said oscillator, the products of said mixing means being identical in frequency when said signal derived from the oscillator is equally between the reference signals and differing in frequency when the signal derived from the oscillator varies therefrom; means responsive to mixing products which differ in frequency, establishing a control signal; and means for applying said control signal to the control element of said oscillator.

3. A freqnency generator, comprising: a variable frequency oscillator having a control element; a source of a plurality of reference signals having related frequencies; means for selecting two reference signals equally spaced in frequency on either side of the signal derived from the desired oscillator frequency; a balanced detector for mixing the signal derived from said oscillator with the two selected reference signals; means for deriving from said detector signals having frequencies equal to the difference between the signal derived from said oscillator and said two reference signals; means responsive to derived detector signals which differ in frequency for establishing a control signal; and means for applying said control signal to the control element of said oscillator.

4. The frequency generator of claim 3, wherein said means for deriving a control signal includes a diode detector.

5. A frequency generator, comprising: a variable frequency oscillator having a control element; a plurality of cascade-connected mixing stages connected with said oscillator; a source of a plurality of reference signals for each mixing stage, the frequency separation between reference signals for each mixing stage being less than the separation between the signals for the preceding stage; means for connecting selected reference signals with each mixing stage, including means for selecting two reference signals equally spaced in frequency on either side of the signal derived from the desired oscillator frequency for connection with the last mixing stage, the products of said last mixing stage being identical in frequency when the signal derived from the oscillator is equally between the reference signals connected therewith and differing in frequency when the signal derived from the oscillator varies therefrom; means connected with said last mixing stage and responsive to mixing products therefrom, establishing a control signal; and means for applying said control signal to the control element of said oscillator.

6. A frequency generator, comprising: a variable frequency oscillator having a control element; a source of a plurality of reference signals having related frequencies; means for mixing at least three signals derived from said oscillator and source of reference signals, with at least one signal coming from each, the mixing products being identical in frequency when one of said signals is equally between the other two and of different frequencies when said one signal deviates therefrom; means responsive to a difference between said mixing products for deriving a control signal; means for applying said control signal to the control element of said oscillator; a source of auxiliary control signal; and means responsive to the derived control signal for applying the auxiliary control signal to the control element of said oscillator.

References Cited by the Examiner

UNITED STATES PATENTS

| | | | |
|---|---|---|---|
| 2,777,064 | 1/57 | Robinson | 331—22 X |
| 2,838,673 | 6/58 | Fernsler et al. | 331—31 |
| 2,888,562 | 5/59 | Robinson | 331—2 |

FOREIGN PATENTS

| | | |
|---|---|---|
| 1,010,588 | 6/57 | Germany. |

BENNETT G. MILLER, *Acting Primary Examiner.*

HERMAN KARL SAALBACH, GEORGE N. WESTBY, ROY LAKE, *Examiners.*